United States Patent
Shamsunder et al.

(10) Patent No.: US 6,856,625 B1
(45) Date of Patent: Feb. 15, 2005

(54) APPARATUS AND METHOD OF INTERLEAVING DATA TO REDUCE ERROR RATE

(75) Inventors: Sanyogita Shamsunder, Basking Ridge, NJ (US); Keith Faulk Conner, Bonnton, NJ (US); Richard Paul Ejzak, Wheaton, IL (US); Sanjiv Nanda, Clarksburg, NJ (US); James Paul Seymour, Lake Hiawatha, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/568,004

(22) Filed: May 10, 2000

(51) Int. Cl.[7] .............................................. H04L 12/56
(52) U.S. Cl. ...................... 370/394; 370/474; 375/262; 375/265; 714/756; 714/761; 714/772
(58) Field of Search ................................ 370/394, 474, 370/232–234, 252–253, 328–329, 332–337, 341–342, 465, 468–469, 473, 479, 480, 493, 522, 527–528, 543–545; 375/261, 262, 263, 265, 225, 240.24, 240.27, 260, 341; 714/755, 756, 761, 772, 701, 746, 751, 752, 758

(56) References Cited

U.S. PATENT DOCUMENTS

| 5,862,186 | A | * | 1/1999 | Kumar | 375/324 |
| 5,909,434 | A |   | 6/1999 | Odenwalder et al. | |
| 5,936,979 | A | * | 8/1999 | Jyrkka | 714/763 |
| 6,381,455 | B1 | * | 4/2002 | Smolik | 455/421 |

FOREIGN PATENT DOCUMENTS

| GB | EP 0382 362 | 1/1990 | ............. H04J/3/16 |
| WO | WO 00/03486 | 1/2000 | .......... H03M/13/22 |

* cited by examiner

*Primary Examiner*—Dang Ton
*Assistant Examiner*—Inder Pal Mehra

(57) ABSTRACT

A method and apparatus for reducing the information error rate of a communication network. The apparatus comprises a selector device coupled to a Framer and to an Interleaver. The selector device is configured to receive system information and the Framer is configured to receive user information. The apparatus is coupled to equipment which operate the communication network based on system parameters. The apparatus and method of the present invention improve the coding and effectively increase the interleaving depth applied to user information thus reducing the information error rate of the communication network without having to alter or modify any of the system parameters.

11 Claims, 6 Drawing Sheets

APPARATUS AND METHOD OF INTERLEAVING DATA TO REDUCE ERROR RATE

BACKGROUND OF THE INVENTION

1. Field of the Invention

The present invention is generally related to an apparatus and method of interleaving data conveyed over a communication network.

2. Description of the Related Art

Many communication networks convey information (i.e., transmit and receive information) in the form of packets. These well known communication networks are generally referred to as packet switching networks. A packet represents information in digital form, generally comprising three portions: a header, a payload portion and a trailer portion. Each of the portions is a group of bits. The header and trailer portions contain system information used to initiate, maintain and terminate communication between users of the communication network. For example, the header or trailer or both contain digital information relating to the routing of the packets from their source to their destination. The payload contains the information being conveyed by a user. All information conveyed by a user is hereinafter called "user information." For example, the payload can represent voice, video, music or data. The data information is digital data that can represent graphics information, textual information and other types of information. Packet switching networks are wireline or wireless communication networks that support a plurality of users.

Wireless communication networks use various schemes—called multiple access schemes—to allow a plurality of users to use (i.e., share simultaneously) the network. Examples of well known multiple access schemes are Code Division Multiple Access (CDMA), Frequency Division Multiple Access (FDMA) and Time Division Multiple Access (TDMA). Typically, the communication network is allocated a specific bandwidth within which it may convey its communication signals. The bandwidth is a portion or the entire band of frequencies allocated to the communication network for conveying information.

A TDMA communication network allows multiple users to use the same bandwidth by creating time frames (hereinafter "frames") during which users can convey information and where each frame is divided into time slots (hereinafter "bursts"). A burst or a group of bursts is identified and assigned to each user of the TDMA networks. Many existing wireless TDMA communication networks were established to convey mainly digital data. Examples of well known data communication networks are the General Packet Radio Service (GPRS) and Enhanced GPRS (EGPRS). As with any communication networks, the data communication networks follow protocols that are established into standards. Well known standards derived from protocols are used for different types of communication networks throughout the world. A protocol is a set of rules or procedures or both that is used to initiate, maintain and terminate communications among users of the network. Communications (i.e., conveying of communication signals) between users and system equipment are also based on protocols. The system equipment are owned, controlled and operated by system operators or providers. The system equipment are operated in accordance with the protocol.

EGPRS networks follow an EGPRS standard that defines how users gain access to the network and how the users' information that is being conveyed within the network is to be processed. Access to a communication network is the ability of a user to use the resources (e.g., system equipment, bandwidth) of the communication network. Users attempt to gain access to the communication network with user equipment such as cell phones and wireless computers. Thus, user equipment is any type of equipment typically used by users of a communication network. In an EGPRS communication network, the type of information that is typically conveyed is digital information. The digital information may represent, for example, real time video or voice signals that have been digitized and packetized in a well known manner.

Referring to FIG. 1, there is shown a portion of the system equipment for an EGPRS communication network. The equipment shown in FIG. 1 is part of the equipment used at a base station or a node of an EGPRS network to transmit information (user and system information) to user equipment in the form of a communication signal. The communication signal, which is typically a Radio Frequency (RF) sinusoidal, carries the information (user and system) being conveyed. The base station is the set of equipment that communicates via wireless channels with users within a certain defined geographical area covered by the base station. The area covered by the base station is typically called a cell. The communication channel through which the base station equipment transmits information is called the downlink. The base station also includes receiving equipment (not shown) which receives information from users within the cell via communication channels called the uplink. FIG. 1 also represents part of user equipment which transmit information (as per the EGPRS standard or other standard) over the uplink to base station equipment. However, for ease of explanation and to prevent redundancy in the text, FIG. 1 will hereinafter be explained in the context of system equipment at a base station.

Still referring to FIG. 1, user information, typically in the form of bits, is applied to Radio Link Control (RLC) framer 102. RLC framer 102 is a device that arranges the user information into RLC blocks. An RLC block is simply a grouping of bits based on a particular format established by the standard being followed by a communication network. Each RLC block has a Header portion and a trailer portion within which system information is placed. User information is placed in the DATA portion of the RLC block. The RLC blocks are then applied to Coder 104 which performs a coding operation on each of the RLC blocks. Essentially, the coding operation adds redundancies to user information so as to combat against errors that occur when the information is transmitted through the downlink. In this example, we suppose that the particular coding scheme used by coder 104 is a well known coding scheme called convolutional coding. The convolutional coding has a certain ratio of output bits (k) to input bits (n) called a Rate $$\frac{k}{n}.$$

A Rate $$\frac{1}{3}$$

convolutional coder outputs three bits for every input bit. For example, a Rate $$\frac{1}{3}$$

convolutional coder generates three coded sub-blocks for every RLC block applied to its input.

In communication systems such as the one partially depicted in FIG. 1, relatively great amounts of information are transmitted as intermittent bursts. A packet burst can be adversely affected by communication channel anomalies causing a great amount of information to be lost. Some of these anomalies are phase jitter, frequency translation, amplitude and phase fading and multipath distortions. An additional scheme typically used in packet switched networks to combat errors is the technique of interleaving. Interleaving is a process by which the time order of coded portions of one or more coded Radio Link Control (RLC) blocks are scrambled. Basically, interleaving adds time diversity to the information being transmitted by spreading out the information from any particular coded RLC block over time. The plurality of RLC blocks may be from one or more than one user, but interleaving is typically performed over a single RLC block from a single user. Through interleaving, if a burst of received information is adversely affected, only a portion of any particular coded RLC block is impacted. This decreases the likelihood that all of the information for a particular coded RLC block is corrupted and thus allows a convolutional decoder (not shown) to enhance its ability to perform error correction. There are different well known types of interleaving methods, which basically define how different units of information are processed to implement the interleaving process. Some of these well known interleaving methods include block interleaving, chain interleaving and diagonal interleaving. An interleaver is said to have depth which is directly related to the amount of time that it takes to transmit a particular block of information. The more spreading of a specific amount of information over time, the more depth the interleaving process is said to have. Thus, the interleaving depth is the time period within which a certain amount of information is interleaved.

The coded information from Coders 104 is applied to Interleaver 108 after having been punctured by Puncturer 106. Puncturer 106 performs an operation known as puncturing. Puncturing is the selective removal of portions of coded information in accordance with a particular algorithm. Particular portions of the coded information are removed from particular locations in the information and discarded. After the coded and punctured information is transmitted through a channel and received, the receiving equipment inserts predefined information into those particular locations. For example, for digital information, most standardized puncturing algorithms cause the receiving equipment to insert a "0" bit in place of missing information. The punctured information is usually chosen such that the receiver, through convolutional decoding, can determine all of the unsent information assuming most of the sent information was received correctly.

The output of Interleaver 108 is applied to Modulator 110. Modulator 110 performs a standard digital modulation operation called Phase Shift Keying (PSK). A particular type of PSK modulation called 8-PSK, which generates a communication signal for every three bits of information (user and system) from Interleaver 108, is used. Another type of modulation is called Gaussian Minimum Shift Keying (GMSK), which generates a communication signal for every bit of information. The frequency content of the communication signal generated by Modulator 110 falls within the bandwidth allocated to the communication network. The output of Modulator 110 is applied to Radio Transmitter 112 which amplifies and transmits the communication signal over downlink channels to designated users of the communication network.

The use of a particular modulation scheme in conjunction with a specific type of coding is directly related to a communication network's ability to prevent errors or correct errors or both that occur when communication signals are subjected to channel anomalies. Several Modulation Coding Schemes (MCS) have been well defined for various types of communication networks by the European Telecommunications Standards Institute (ETSI) EGPRS standard and EDGE standard. For example, MCS1–MCS9 are nine known schemes which specify the type and nature of coding and modulation used for EGPRS. In particular MCS1–MCS4 use a GMSK modulation scheme and various types of coding. MCS5–MCS9 use an 8-PSK modulation scheme and different types of coding. Moreover, particular interleaving schemes and framing arrangements are associated with the MCS. For example, for MCS9, block interleaving is used and two RLC blocks are formatted for transmission during a time block of the communication system. The time block is a period of time during which the communication network transmits or receives a unit of information as defined by the standard with which the communication network complies. For an EGPRS system using an MCS9 scheme, the time block is 20 milliseconds during which time two RLC blocks are transmitted. For other MCS, the number of RLC blocks transmitted during a time block may be different.

The particular coding, puncturing, interleaving and modulation values or schemes (hereinafter referred to as system parameters) being implemented by a communication network can be changed or modified based on the quality of service being provided by a service provider. The system equipment (or user equipment) operate the communication network by processing user information and system information based on the system parameters. Any one or any combination of some or all of the system parameters or their values can be changed statically and/or dynamically(i.e., during transmission of information). At any instant each parameter has a specific value or scheme associated with it. For example, a value for the coding scheme is the coding rate and a value for the interleaving scheme is the interleaving depth. A service provider will attempt to apply the proper system parameter values to meet particular quality of service requirements set by a standard or required by subscribers of the communication network. Different standards use different parameter values to meet the requisite quality of service. One particular measure of the quality of service of a communication network is the Information Error Rate (IER). The IER is typically a ratio of the amount of errors in received information to the total amount of information received for a specific period of time. Some examples of well known information error rates are the Bit Error Rate (BER), the Block Error Rate (BLER), the Frame Error Rate (FER) and the Character Error Rate (CER). In all these cases, the IER is the ratio of the number of erroneous units of information (e.g., bits, blocks, frames, characters) to the total number of units of information received for a defined period of time.

Referring to FIG. 2, there is shown the particular arrangement of RLC blocks for a downlink channel of a communication network that is using the MCS9. RLC blocks 204 and 206 are transmitted during a 20 ms period. Each RLC block contains Header and trailer information that specify, inter alia, the particular interleaving, coding and puncturing schemes being used. FIG. 2 shows information typically associated with one user of the communication network. During the occurrence of a downlink block, information from a plurality of users is being transmitted by the system equipment. FIG. 3 shows a TDMA format that allows a plurality of users to share a downlink channel. Downlink block 300 comprises four frames (302, 304, 306 and 308). Each of the four frames comprises eight bursts. For purposes of illustration, the format of the fifth burst of frame 304 (i.e., burst 304a) is shown. The information conveyed during burst 304a is arranged as different fields. The Header and Trailer fields contain system information used by the system equipment of the communication network to initiate communication between users, maintain communication (including routing of the packets) and terminate communications. User information and system information are transmitted during the DATA fields of burst 304a. The TS field is a Training Sequence field during which system information is transmitted that helps user equipment receiving the DATA to synchronize with the base station equipment. The Header and Trailer fields represent system information from the RLC Header and Trailer portions and other system information.

The information (user and system) contained in the RLC blocks are transmitted during particular bursts of particular frames assigned to a user. For a communication network using MCS9, the information contained in the two RLC blocks-after having been coded and punctured—is transmitted during four bursts of the four different frames of a downlink block. The information is spread over the four frames due to the interleaving process. Because of the spreading, receiving user equipment (not shown) must wait for at least the duration of the downlink block (approximately 20 ms) before it can demodulate and decode the received information. For example, the user equipment must wait until it has received all four frames of a broadcast downlink block before it can decode the two RLC blocks. As the interleaving depth is increased, the resulting delay can cause noticeable gaps in the received information. However such gaps can be eliminated if the received information is buffered (i.e., temporarily stored contiguously) so that the information is output in continuous fashion. In effect, the buffer adds additional delay to the received information. As long as the delay gaps due to spreading are less than the delay added by the buffer, such gaps can be eliminated. When a buffer is used, there is a delay in initially receiving the information, but the information exiting the buffer has no gaps (assuming that the buffer is sufficiently large to encompass the gaps occurring due to spreading).

For certain types of information, such as voice, real time video, and music, relatively small gaps in the reception of information are usually unacceptable. These types of information, which are generally called streaming and conversational services, by their very nature cannot tolerate gaps. A gap in information representing voice, music and real time video can cause discernable distortions that reduce the quality of the information. The extent of the distortions can be such that most or all of the received information becomes unintelligible due to an increase in IER. Furthermore, streaming and conversational services typically require relatively lower IER than other types of information.

The ETSI EDGE or EGPRS standard which uses one of the MCS1–MCS9 schemes allows for coding and interleaving RLC blocks over a time block (i.e., four frames). These schemes yield a resulting IER that often is not acceptable for streaming and conversational services. Additional coding and interleaving can be executed so as to reduce the IER, but such additional processing require modifications in the system and user equipment that transmit and receive information in accordance with such standards. Such modifications translate to additional cost of operation to system operators or providers because in many cases new hardware and software would be necessary. Also, such modifications would require relatively large amounts of amendments to well established standards—again resulting in hardware and software modifications to user and system equipment that increase the cost of operation to service providers.

Therefore, a method and apparatus for reducing the IER of a communication network without any substantial modification to user and system equipment and which can be executed within the context of an established standard (i.e., set of established system parameter values) is required. Such a method and apparatus will allow service providers to provide streaming and conversational services with little or no additional cost of operation to system providers. What is further needed is a method and apparatus by which the IER is reduced while still using an established set of system parameter values designated by a standard such as EGPRS or EDGE.

SUMMARY OF THE INVENTION

The present invention provides an apparatus and method for reducing the IER of a communication network being operated by communication equipment based on system parameters. The present invention allows the IER to be reduced without having to alter or modify any of the system parameters or their values. The present invention allows for the processing of user information based on received system information so that such parameters as coding and interleaving are effectively improved. In particular, the coding rate is effectively decreased and the interleaving depth is effectively increased without having to alter or modify the coding rate and interleaving depth of the communication equipment which process user information.

The apparatus of the present invention comprises a selector device coupled to an Framer, and an Interleaver. The Interleaver is coupled to the Framer and to communication equipment typically used to process user information. The Framer creates information groupings; that is, the Framer is configured to receive user information and arrange the user information into groupings of information and generate multiple copies of each information grouping based on system information received by the selector device. For communication networks complying with the EGPRS or EDGE standards, the information groupings are called RLC blocks and the Framer is an RLC framer. The selector device instructs the Framer as to the number of copies of an information grouping that is to be generated by the Framer. In general, the Framer can generate N copies of an information grouping where N is an integer equal to 1 or greater. The generated information groupings are applied to the Interleaver, which based on system information received by the selector device, is able to interleave the generated frames over a selectable number of time blocks of the communication network. The operations performed by the Framer and the Interleaver effectively increase the interleaving depth and effectively decrease the coding rate of the user information being transmitted thus reducing the IER of the communication network without having to alter or modify the particular set of system parameters (or their values) being used by the communication network. The interleaved user information is then applied to the communication equipment for processing based on system parameters.

In general, the method of the present invention comprises the steps of: (1) generating, based on received system information, N copies of information groupings for a user of the communication network where N is an integer equal to 1 or greater; and (2) processing, based on received system information, the generated information groupings resulting in M information groupings for the user, where M is an integer equal to 1 or greater (M may or may not be equal to N), whereby the M information groupings are transmitted over a selectable number of time blocks of the communication network thus reducing the IER of the communication network. The second step involves applying the N generated information groupings to the communication equipment so that M information groupings result after the processing by the communication equipment. The steps of the method of the present invention are performed without having to modify or alter any of the system parameters under which the communication equipment operate the communication network.

BRIEF DESCRIPTIONS OF THE DRAWINGS

DETAILED DESCRIPTION

Figure 1:
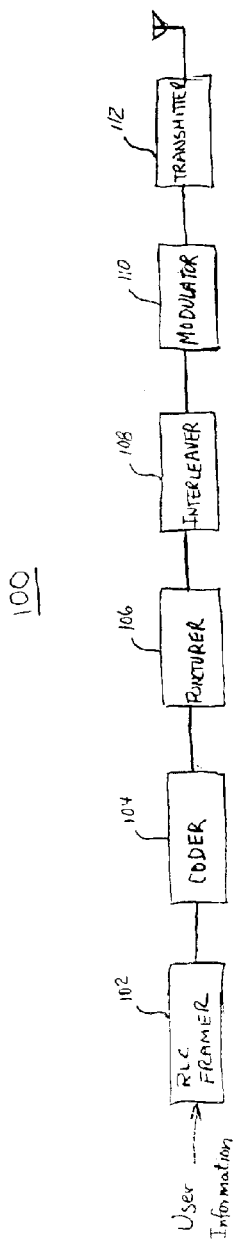
FIG. 1 depicts typical communication equipment used to process and transmit information.

The method and apparatus of the present invention are able to reduce the IER of a communication network to which they are applied without having to alter or modify the system parameters (or their values) being used by the system equipment or user equipment for operation of the communication network. In particular, the coding of the communication network is effectively improved and the interleaving depth is effectively increased without having to modify the system parameters resulting in a decreased IER. The improvement in the coding and the increased in the interleaving depth are achieved based on system information received by the apparatus of the present invention. In certain embodiments of the present invention discussed infra, the coding is improved by not only is decreasing the coding rate, but additional repetition of the information being transmitted is created which serves to further reduce the IER.

The apparatus of the present invention comprises a selector device coupled to a Framer, and an Interleaver. The Interleaver is coupled to the Framer and to system or user equipment typically used to process user information. The Framer creates information groupings; that is, the Framer is configured to receive user information and arrange the user information along with system information into groupings of information and generate multiple copies of each information grouping based on system information received by the selector device. The system information within the information grouping contains, amongst other things, the system parameters being used by the communication network. The system information is generated by other system equipment (not shown) and such system information is used by the apparatus of the present invention and the typical equipment (coupled to the apparatus of the present invention) to perform the appropriate processing discussed below.

The selector device instructs the Framer as to the number of copies of an information grouping that is to be generated by the Framer. In general, the Framer can generate N copies of an information grouping where N is an integer equal to 1 or greater. The generated information groupings are applied to the Interleaver, which based on system information received by the selector device, is able to interleave the generated information groupings over a selectable number of time blocks of the communication network prior to being processed by user or system equipment. In a preferred embodiment of the present invention, the system information contained within the generated information groupings is processed separately from the user information contained in the information groupings. For example, in an EGPRS communication network, the Header portion of the RLC blocks are processed (convolutional coding and Cyclic Redundancy Coding (CRC)) separately from the DATA portion of the RLC block to provide more robust error protection and detection. The protection afforded to the Header makes the system information—which contains system parameters that dictate how RLC blocks are to be interleaved and coded—relatively more reliable. The operations performed by the Framer and the Interleaver effectively increase the interleaving depth and improve the coding applied to the user information being transmitted thus reducing the IER of the communication network without having to alter or modify the particular set of system parameters (or their values) being used by the communication network. For example, communication networks which operate in accordance with standards (e.g., EGPRS or EDGE) that use a limited set of system parameter values (e.g., MCS1–MCS9) can still reduce their IER without having to alter or modify the system parameters or their values. It should be noted that the present invention applies to any set of system parameters and is not at all limited to currently defined set of system parameters such as MCS1–MCS9.

Figure 4:
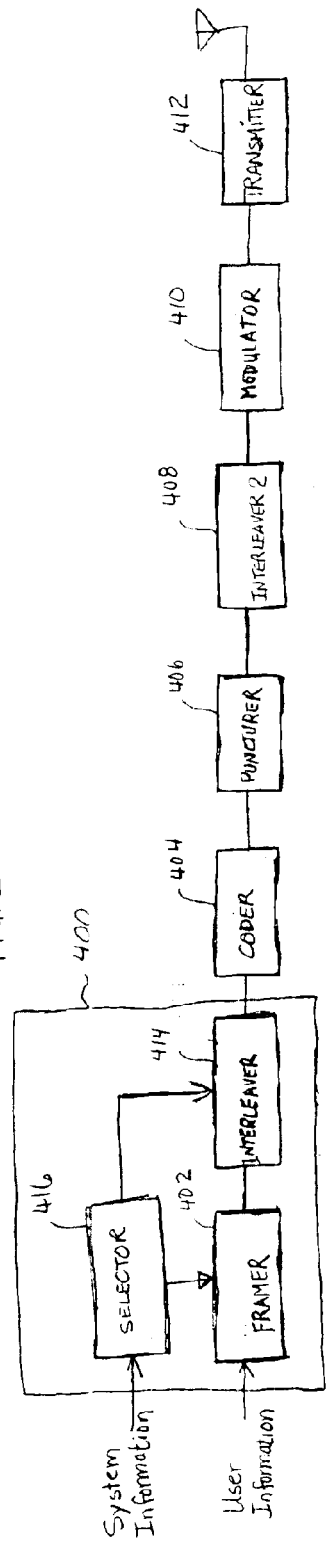
FIG. 4 depicts the apparatus of the present invention coupled to typical communication equipment.

Referring to FIG. 4, there is shown apparatus 400 of the present invention comprising selector device 416 coupled to Framer 402 and Interleaver 414. Framer 402 is further coupled to Interleaver 414. Apparatus 400 is coupled to equipment typically used to transmit user and system information. The equipment can be typical system equipment used to transmit user and system information over a downlink channel or typical user equipment used to transmit user and system information over an uplink channel. The selector device is configured so as to cause Framer 402 and Interleaver 414 to operate in accordance with the received system information. The typical equipment comprises Coder 404 coupled to Puncturer 406 which is coupled to Interleaver 408. Interleaver 408 is coupled to Modulator 410 which is coupled to Transmitter 412.

For ease of explanation, suppose the typical equipment is system equipment that is transmitting information in accordance with the well known MCS9 over a downlink channel where Coder 404 is a convolutional coder having a coding rate of Also, suppose that based on received system information, selector device 416 instructs Framer 402 to generate a set of three identical copies of each RLC block created for a user; thus, N=3. Since for MCS9, two RLC blocks are transmitted per downlink block, Framer 402 creates a first RLC block ($F_1$) and a second RLC block ($F_2$). RLC framer 402 then generates a triplicate set for each of the two created RLC blocks, i.e., ($F_1$, $F_1$, $F_1$) and ($F_2$, $F_2$, $F_2$). Both triplicate sets are then applied to Interleaver 414. Interleaver 414 performs the interleaving operation by reordering the generated blocks such that they are paired in a mixed manner. This process of mixed pairing is continued with subsequent pairs of sets so that each pair has RLC blocks from different sets. In particular, interleaver 414 pairs one of the RLC blocks from the first set with one of the RLC blocks from the second set resulting in mixed pairs, i.e., ($F_1$, $F_2$), ($F_1$, $F_2$), and ($F_1$, $F_2$). Interleaver 414 can perform the mix pairing between more than two sets of RLC blocks to achieve different types of interleaving such as block or chain interleaving. The interleaved blocks are then applied to the typical system equipment for processing. It should be noted that the system equipment can alter or modify system parameters or values independent of the operation of apparatus 400 of the present invention.

The frames from Interleaver 414 are applied to Coder 404 which, because of its coding rate of $$\frac{1}{3},$$

generates three coded sub-blocks for each of the frames from Interleaver 414. A pair of blocks from Interleaver 414 thus becomes three pairs of coded sub-blocks; that is each of the paired RLC blocks ($F_1$, $F_2$) becomes ($f_{1a}$, $f_{1b}$, $f_{1c}$; $f_{2a}$, $f_{2b}$, $f_{2c}$). Each of the coded pairs of blocks becomes a set of coded sub-blocks. Each of the three sets of coded sub-blocks from Coder 404 are applied to Puncturer 406 which according to the MCS9 discards two of every three coded sub-blocks generated by Coder 404 for each block. Thus, for each RLC block only one of the coded sub-blocks remains or one coded pair remains for each of the three coded pairs generated by Coder 404. According to the MCS9, Puncturer 406 alternatively applies one of three puncturing algorithms ($P_1$, $P_2$, $P_3$) for successive sets of coded sub-blocks received from Coder 404. Thus, algorithm $P_1$ is applied to the first set of coded sub-blocks, $P_2$ is applied to the second set of coded sub-blocks, $P_3$ is applied to the third pair of coded sub-blocks, $P_1$ is applied to the fourth pair of frames and so on. For example, algorithm $P_1$ discards $f_{1b}$ and $f_{1c}$, for block $F_1$ and $f_{2b}$ and $f_{2c}$ for block $F_2$ resulting in ($f_{1a}$, $f_{2a}$). Because of the puncturing operation, the effective coding rate is 1 since one coded sub-block results at the output of Puncturer 406 for each block created by Framer 402. However, because the present invention causes replicas of the same block to be generated, the process continues with the second pair of RLC block ($F_1$, $F_2$) which as before is coded and punctured (but with algorithm $P_2$) resulting in the coded pair ($f_{1b}$, $f_{2b}$). Similarly, the third pair of RLC block results in the coded pair ($f_{1c}$, $f_{2c}$) whereby puncturing algorithm $P_3$ was used. Therefore, for this particular example, the coding for frame $F_1$ and $F_2$, is improved because the coding rate is decreased from 1 to $$\frac{1}{3}.$$

Furthermore, the interleaving depth is increased because instead of transmitting one coded sub-block over one time block for each RLC block created, the information associated with each block is contained within three coded sub-blocks which must be transmitted over at least 3 time blocks.

Figure 3:
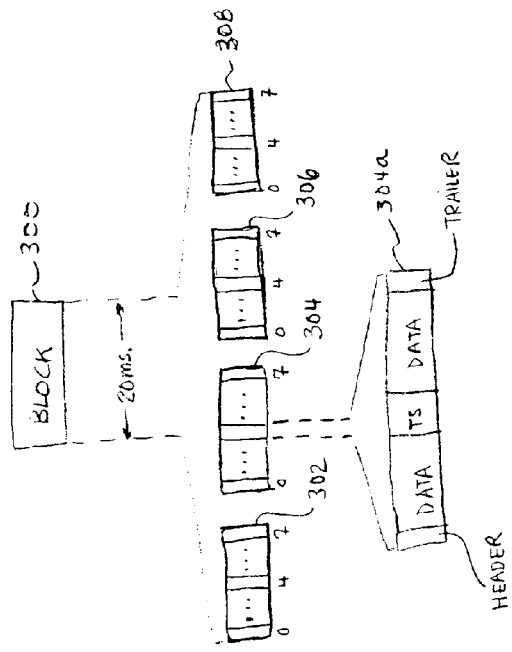
FIG. 3 depicts the format of a time block for a TDMA system compliant with the ETSI EDGE standard or EGPRS standard.
Figure 2:
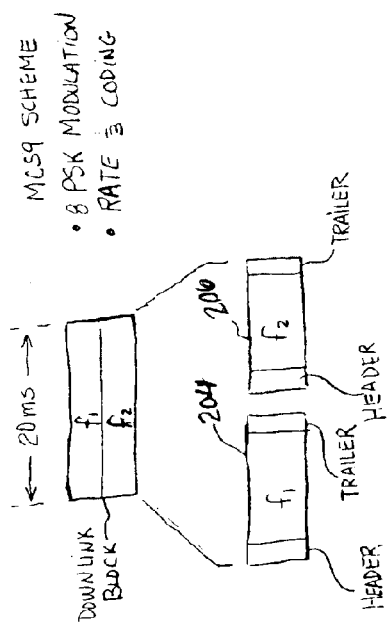
FIG. 2 depicts how information is arranged and interleaved within the time block of an ETSI EDGE and/or EGPRS compliant network.

Portions of each of the resulting coded sub-blocks are interleaved by Interleaver 408, 8-PSK modulated by modulator 410 and transmitted during corresponding bursts (e.g., burst 304a; see FIG. 3) of the four frames of a downlink block so that two RLC blocks are transmitted during a 20 ms downlink block. Therefore, in this example, three coded sub-blocks are transmitted over the downlink channel during a time period lasting at least three downlink blocks (or 60 ms). It should be noted that the interleaving depth can be further increased by transmitting RLC blocks for a particular user over a period greater than 60 ms; this can be done when Interleaver 414, based on received system information, reorders the blocks so that RLC blocks for a particular user are not transmitted in consecutive downlink blocks. It should be further noted that Interleaver 414 of the: apparatus of the present invention interleaves RLC blocks (or in general, interleaves information groupings) whereas Interleaver 408 interleaves portions of RLC blocks (or in general, portions of information groupings). Particular examples of the method of the present invention showing how the interleaving depth for different users are increased (as well as how their coding rates are decreased) are discussed below.

The exact configuration of the apparatus of the present invention shown in FIG. 4 is determined by various system parameters. These system parameters comprise the modulation and coding schemes available, the interleaving depth, the interleaving method desired (block, chain, diagonal, etc.), the degree of repetition of RLC blocks (i.e., the value for N), and the amount of information selectively removed by the puncturing operation. It should be noted that the particular architecture depicted in FIG. 4 of the present invention is only one of many different possible implementations of the apparatus of the present invention. One skilled in the art to which this invention belongs can certainly design other architectures that allows information groupings to be replicated N times and interleaved over at least one time block of a communication network and then processed by typical user or system equipment so as to reduce the IER of the communication network.

Specific choices for these system parameters are based on various factors designated by the service provider. For example, one factor is the environmental conditions affecting the communication network. Another factor is the relative speed of user equipment with respect to the base station. Yet another factor is the predominant type of information being conveyed over the communication network (for example, a communication network which conveys predominantly real time video information may require more interleaving—i.e., lower information error rate—than a communication network which conveys predominantly voice information). The service provider can establish various thresholds based on these factors such that the communication network automatically switches among choices of system parameters based on changing conditions that affect the performance (information error rate, delay, etc.) of the communication network.

The method of the present invention comprises the steps of: (1) generating, based on received system information, N copies of information groupings for a user of the communication network where N is an integer equal to 1 or greater; and (2) processing, based on received system information, the generated information groupings resulting in M information groupings (e.g., coded sub-blocks) for the user, where M is an integer equal to 1 or greater (M may or may not be equal to N), whereby the M information groupings are transmitted over a selectable number of time blocks of the communication network thus reducing the IER of the communication network. The second step involves interleaving the information groupings and applying the N interleaved and generated information groupings to the typical equipment (i.e., Coder 404, Puncturer 406, Interleaver 408, modulator 410 and transmitter 412) so that M information groupings result after processing by such equipment. It should be noted that N can equal to 0 in a case where the system provider for whatever reason does not wish to generate copies of an information grouping created by Framer 402.

Figure 5:
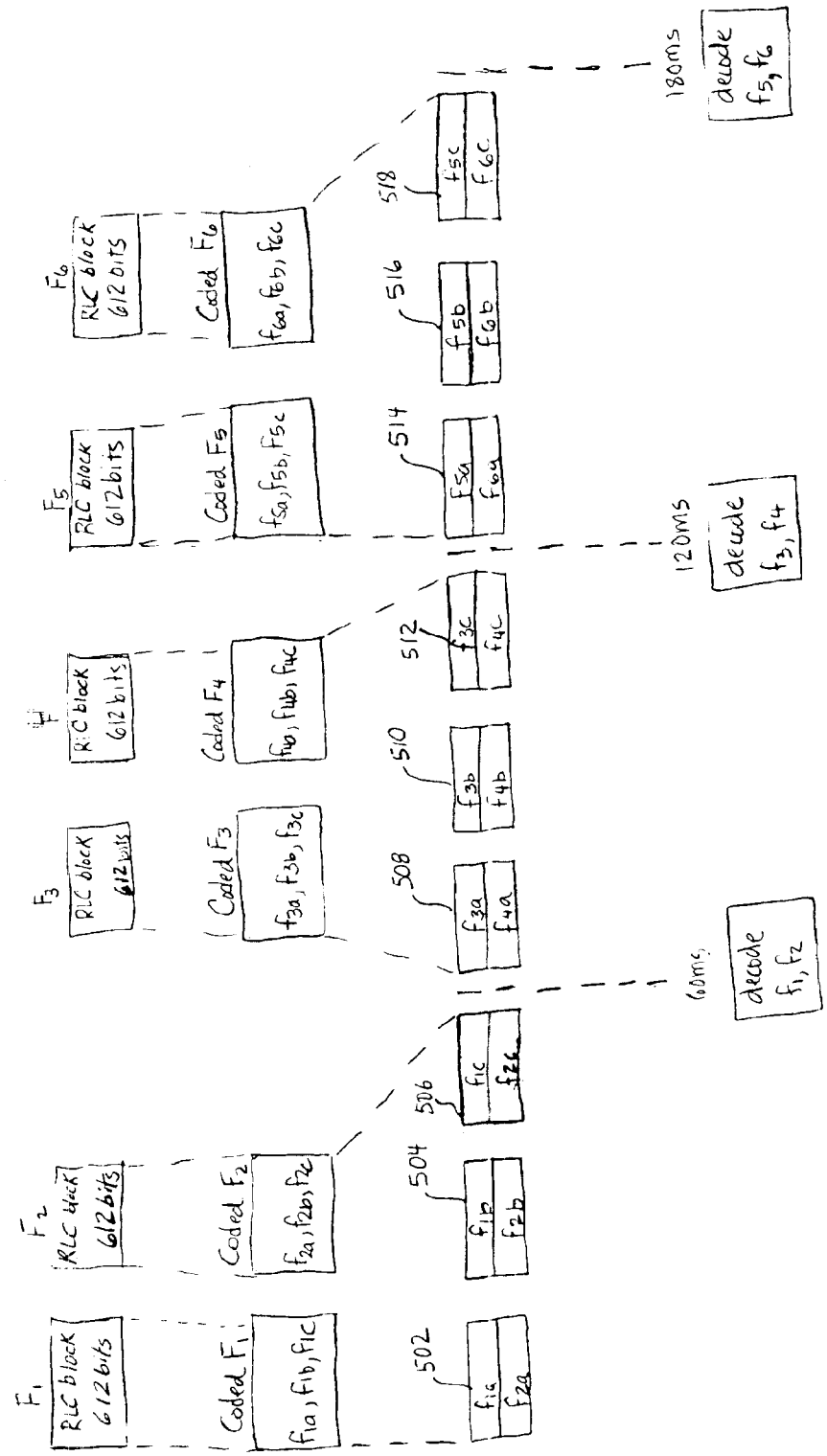
FIGS. 5, 6 and 7 depict various versions of the arrangement of conveyed information as per the method of the present invention.

Referring to FIG. 5, the method of the present invention is shown for N=3 and for a communication network compliant with EGPRS using MCS9; note this example was discussed in the discussion supra describing the operation of the apparatus of the present invention. For ease of explanation, only six RLC blocks are shown being transmitted. It will be readily obvious to one skilled in this art that the method of the present invention applies to any number of RLC blocks being transmitted. In the first step of the method of the present invention, an RLC block is created. Note, for EGPRS using MCS9, an RLC block contains 612 bits.

In the second step of the method of the present invention, each of the N copies are processed. As previously discussed, the processing comprises the RLC blocks being interleaved based on received system information and the interleaved blocks are then coded; the resulting coded sub-blocks are then punctured. Each of the resulting coded sub-blocks from the puncturing operation are interleaved over a time block (i.e., 20 ms), modulated and transmitted. It should be noted that for this example, the resulting three coded sub-blocks are interleaved over three time blocks using a block interleaving scheme (as opposed to a chain interleaving scheme discussed infra); that is the coded sub-blocks are interleaved so that they are transmitted in consecutive time blocks. In particular, for RLC blocks $F_1$ and $F_2$, the coded sub-blocks are transmitted over time blocks 502, 504 and 506. For RLC blocks $F_3$ and $F_4$, the coded sub-blocks are transmitted over time blocks 508, 510 and 512. For RLC blocks $F_5$ and $F_6$, the coded sub-blocks are transmitted over time blocks 514, 516 and 518. The particular coding and interleaving applied by the method of the present invention shown in FIG. 5 and discussed supra in the description of the apparatus of the present invention is called a 3 MCS9 Block Interleaving Scheme. FIG. 5 shows that each of the RLC blocks requires at least 60 ms to be decoded by receiving equipment (not shown) to which the coded sub-blocks are transmitted.

Figure 6:
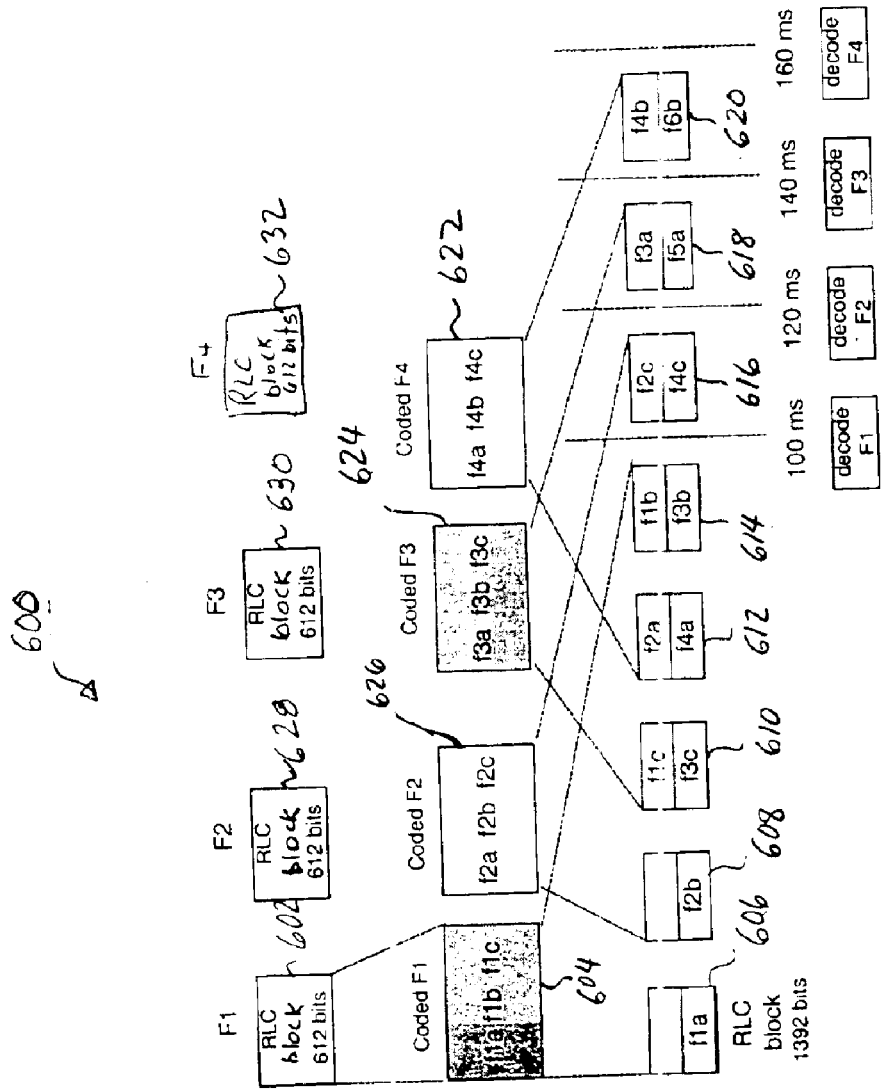
Figure 7:
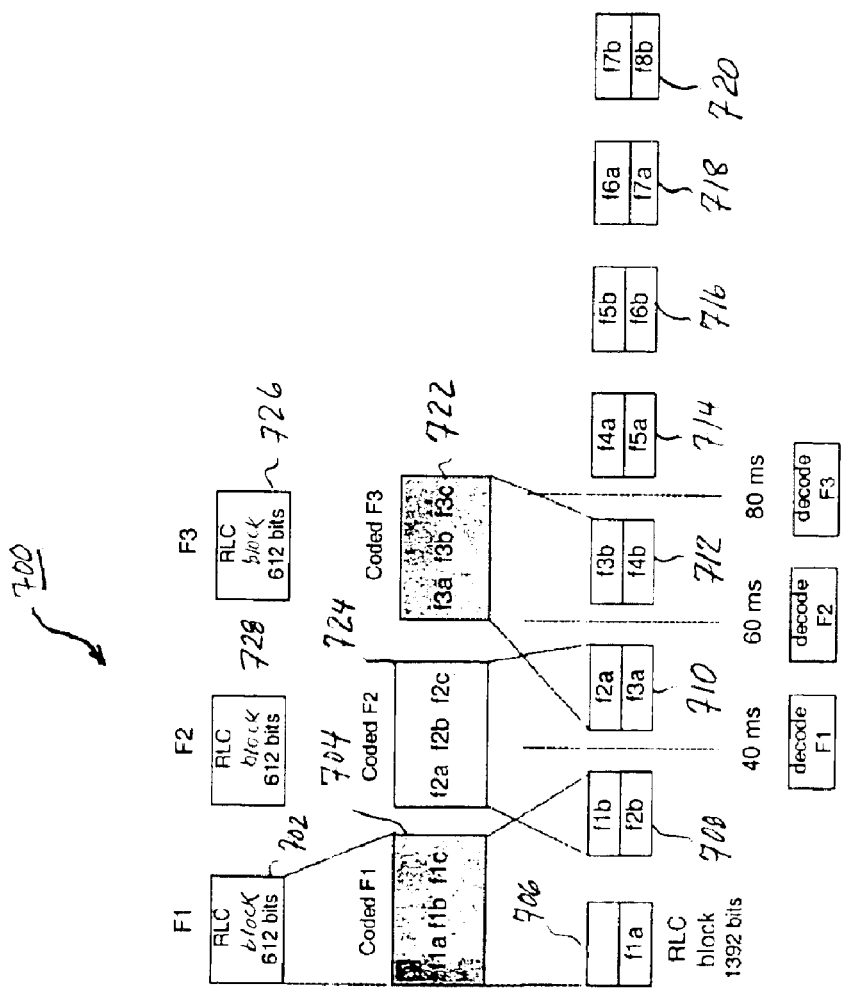

Referring now to FIG. 6 in which the method of the present invention is shown for an EGPRS communication network using MCS9 with N=3 as before but with Interleaver 414 performing a chain interleaving scheme whereby the three coded sub-blocks resulting from each of the RLC blocks are transmitted over 5 time blocks instead of 3 time blocks. The resulting interleaving depth is thus increased from 60 ms to 100 ms. Thus each RLC block requires at least 100 ms to be decoded by receiving equipment (not shown). In particular, three RLC blocks (602, 628, 630 and 632) are shown. The resulting coded sub-blocks (604, 626, 624 and 622) are obtained as explained in the previous examples. Time blocks 606 and 608 contain only one coded sub-block instead of two. Instead of coded sub-block $f_{2a}$ being transmitted in time block 606, it is transmitted in time block 612. Also, coded sub-block $f_{1b}$ is transmitted in time block 614 instead of time block 608. Note also, that the three resulting coded sub-blocks for each RLC block is transmitted over non-consecutive time blocks unlike in the block interleaving scheme previously discussed. Accordingly, the method of the present invention shown in FIG. 6 is referred to as a 3 MCS9 Chain Interleaving Scheme. Referring now to FIG. 7, there is shown the method of the present invention whereby the coded sub-blocks resulting from RLC blocks are interleaved using a chain interleaving scheme. The method of the present invention shown in FIG. 7 is referred to as a 2 MCS9 Chain Interleaving Scheme. Thus, the method is for an EGPRS compliant communication network where N=2 and where Interleaver 414 is again performing a chain interleaving scheme. Because N=2, only two coded sub-blocks are transmitted for each created RLC block. RLC block 702 (i.e., $F_1$) is replicated twice resulting in coded sub-blocks $f_{1a}$ and $f_{1b}$. The coded sub-blocks for RLC block 702 are transmitted during time blocks 706 and 708; the coded sub-blocks for RLC block 728 are transmitted during time blocks 708 and 710; the coded sub-blocks for RLC block 726 are transmitted during time blocks 710 and 712. Although RLC blocks $F_4$, $F_5$, and $F_6$ are not shown, their respective coded sub-blocks are shown being transmitted during time blocks 714, 716, 718 and 720.

Although not shown, the apparatus and method of the present invention can be applied to an EGPRS compliant communication network using MCS9 but with N=4 or N=5 or N=6. For N=4, 4 coded sub-blocks result from the coding and puncturing operations where the puncturing operations used successively are $P_1$, $P_2$, $P_3$, and $P_1$. Thus, for N=4, one of the three puncturing algorithms (i.e., $P_1$) is repeated. The resulting 4 coded sub-blocks are transmitted over at least 4 time blocks; this particular scheme is referred to as a 3-IMCS9. For N=5, 5 coded sub-blocks result from the coding and puncturing operations where the puncturing algorithms used successively are $P_1$, $P_2$, $P_3$, $P_1$, and $P_2$. The resulting 5 coded sub-blocks are transmitted over at least 5 time blocks; this particular scheme is referred to as 3-2MCS9. For N=6, 6 coded sub-blocks result from the coding and puncturing operations where the puncturing algorithms successively used are $P_1$, $P_2$, $P_3$, $P_1$, $P_2$, and $P_3$. The resulting 6 coded sub-blocks are transmitted over at least six time blocks; this particular scheme is referred to as 3-3MCS9. It will be readily obvious that the apparatus and method of the present invention can use any value for N applied to any MCS. It should be noted that FIGS. 5–7 represent the results of the method of the present invention and do not show all of the steps and operations performed by the apparatus of the present invention as described supra with respect to FIG. 4.

Figure 8:
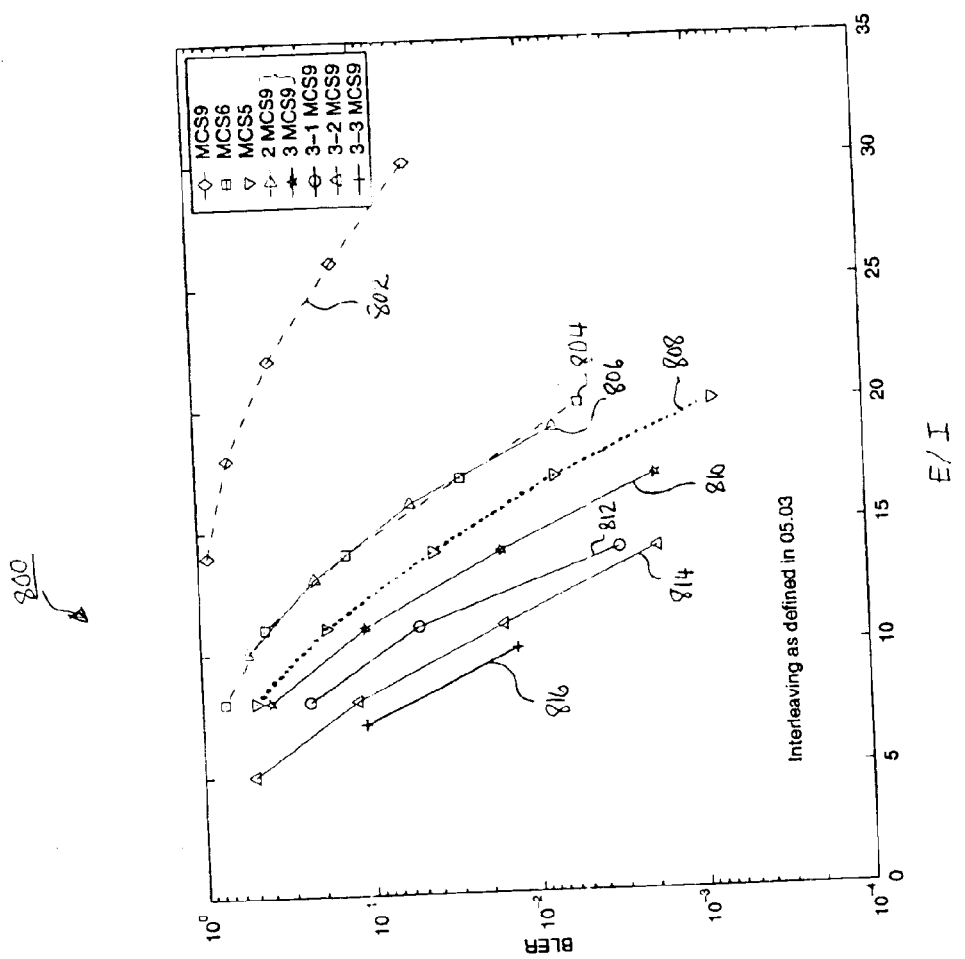
FIG. 8 depicts a performance chart for several standard MCS and for different versions of the present invention.

Referring to FIG. 8, there is shown a graph 800 of several performance charts showing the relative performances of a TDMA network that complies with the EGPRS standard using MCS9, MCS6, MCS5 and various versions (i.e., 2 MCS9, 3 MCS9, 3-MCS9, 3-2MCS9, 3-3MCS9) of the method and apparatus of the present invention. The chart compares Block Error Rate (BLER) with the Energy to Interference ratio (E/I) for each of the schemes. The BLER is a ratio of the number of erroneous time blocks received to the total number of time blocks received for a defined period of time. By definition, the information within an erroneous time block contains errors. The Energy represents the amount of energy needed to transmit the information during a time block to overcome the adverse effects of interference so as to yield a certain BLER. The interference represents the amount of energy contained in other signals that are not intended for a particular user and which adversely affects the signals intended for the user. In many cases, the interference originates from other communication networks or other sources of RF energy.

Still referring to FIG. 8, chart 802 shows the performance for an MCS9 scheme, chart 804 shows the performance for an MCS6 scheme; chart 806 shows the performance for the 2 MCS9 version of the invention; chart 808 shows the performance for an MCS5 scheme; chart 810 is a performance chart for the 3 MCS9 version of the present invention; graph 812 is a performance chart for the 3-1 MCS9 version of the present invention; graph 814 is a performance chart for the 3-2 MCS9 version of the present invention; graph 816 is a performance chart for the 3-3 MCS9 version of the present invention. Graph 800 shows that for a BLER below $10^{-2}$ the various versions of the method of the present invention perform substantially better than the standard MCS9 and MCS6 schemes. The standard MCS5 scheme performs better (by approximately 3 dB) than the 2 MCS9 scheme of the invention, but the other version of the invention outperform the MCS5 scheme by 3 dB or better.

It will be readily understood that the apparatus and method of the present invention are not solely limited to TDMA networks but are applicable to other networks such as CDMA networks whose time blocks are also called frames. Also, the system information on which the operation of the apparatus and method of the present invention is based can be embedded in user information through a well known scheme called in-band signaling. In such a case the embedded system information would still be coded and subject to error correction schemes separate than those applied to the user information.

What is claimed is:

1. An apparatus for transmitting information in a communication network comprising:
    a selector configured to receive system information, to forward an indication of a number of N identical copies to be generated and to forward an indication of an interleaving scheme, based on the system information;
    a framer configured to receive the indication of the number of N copies from the selector, to arrange user information into information groupings and to generate N identical copies of each information grouping where N is an integer equal to 1 or greater and to forward the N copies; and
    an interleaver configured to receive the N generated copies of each information grouping from the framer and the interleaving scheme indication from the selector and to interleave the N generated groupings over a selectable number of time blocks of the communication network in accordance with said interleaving scheme to provide a reduction in a received information error rate.

2. The apparatus of claim 1 wherein the communication network comprises a network selected from the group consisting of at least an Enhanced General Packet Radio Service (EGPRS), Enhanced Global Rates for Global Evaluation (EDGE) network and a combination of both EGPRS and EDGE networks using modulation coding scheme 9 (MCS9) and the framer is a radio link control (RLC) framer.

3. The apparatus of claim 2 where the information groupings are RLC blocks.

4. The apparatus of claim 2 wherein the interleaved groupings are associated with a decreased coding rate and an increased interleaving depth.

5. A method of transmitting information in a communication network comprising the steps of:
    generating, based on received system information, N identical copies of each user information grouping, where N is an integer equal to 1 or greater;
    interleaving the N generated information groupings; and
    transmitting M information groupings selected from the interleaved information groupings over a selectable number of time blocks of the communications network where M is an integer equal to 1 or greater.

6. The method of claim 5 wherein the steps of generating information groupings and interleaving the generated information groupings result in an interleaving depth being effectively increased and a coding rate being effectively decreased.

7. The method of claim 5 wherein the step of generating N copies of each information grouping further comprises the step of arranging user information into each of the information groupings.

8. The method of claim 5 where the communication network comprises a network selected from the group consisting of at least an Enhanced General Packet Radio Service (EGPRS), Enhanced Global Rates for Global Evaluation (EDGE) network and a combination of both EGPRS and EDGE networks and uses MCS9.

9. The method of claim 8 wherein the information groupings are RLC blocks which are interleaved such that 3 mixed pairs of RLC blocks are transmitted over 5 time blocks.

10. The method of claim 8 wherein the information groupings are RLC blocks which are interleaved such that 3 mixed pairs of RLC sub-blocks are transmitted over 3 time blocks.

11. The method of claim 8 wherein the information groupings are RLC blocks which are interleaved such that 2 mixed pairs of RLC sub-blocks are transmitted over 2 time blocks.

* * * * *